US011579334B2

(12) United States Patent
Thoms et al.

(10) Patent No.: US 11,579,334 B2
(45) Date of Patent: Feb. 14, 2023

(54) DETERMINING A WELLBORE LANDING ZONE

(71) Applicant: Enverus, Inc., Austin, TX (US)

(72) Inventors: Michelle Thoms, Calgary (CA); Jianan Qu, Calgary (CA); Jiarao Huang, Calgary (CA); David Howard, Calgary (CA)

(73) Assignee: Enverus, Inc., Austin, TX (US)

( * ) Notice: Subject to any disclaimer, the term of this patent is extended or adjusted under 35 U.S.C. 154(b) by 132 days.

(21) Appl. No.: 17/224,654

(22) Filed: Apr. 7, 2021

(65) Prior Publication Data

US 2022/0326409 A1 Oct. 13, 2022

(51) Int. Cl.
*G06F 30/20* (2020.01)
*G01V 99/00* (2009.01)
*E21B 49/00* (2006.01)

(52) U.S. Cl.
CPC ............ *G01V 99/005* (2013.01); *E21B 49/00* (2013.01); *G06F 30/20* (2020.01); *E21B 2200/20* (2020.05)

(58) Field of Classification Search
CPC ........ G06F 30/20; G01V 99/005; E21B 49/00
USPC .......................................................... 703/10
See application file for complete search history.

(56) References Cited

U.S. PATENT DOCUMENTS

| 8,204,727 B2 | 6/2012 | Dean et al. |
| 8,793,112 B2 | 7/2014 | Levitan |
| 10,345,764 B2 | 7/2019 | Early et al. |
| 2012/0191354 A1 | 7/2012 | Caycedo |
| 2013/0073268 A1 | 3/2013 | Abacioglu et al. |
| 2014/0156194 A1 | 6/2014 | Lupin et al. |
| 2015/0134255 A1 | 5/2015 | Zhang |
| 2015/0233214 A1 | 8/2015 | Dusterhoft et al. |
| 2016/0186496 A1 | 6/2016 | De Bakker et al. |
| 2016/0253767 A1 | 9/2016 | Langenwalter et al. |
| 2017/0364795 A1 | 12/2017 | Anderson |

(Continued)

FOREIGN PATENT DOCUMENTS

WO WO 2016053330 4/2016

OTHER PUBLICATIONS

PCT International Search Report and Written Opinion in International Application No. PCT/US2022/023790, dated Jul. 18, 2022, 8 pages.

(Continued)

*Primary Examiner* — Andre Pierre Louis
(74) *Attorney, Agent, or Firm* — Fish & Richardson P.C.

(57) ABSTRACT

Techniques for predicting a landing zone of a wellbore include identifying a first subsurface geological model of a first subterranean layer located under a terranean surface that includes an upper boundary depth of the first subterranean layer and a lower boundary depth of the first subterranean layer; identifying a second subsurface geological model of a second subterranean layer deeper than the first subterranean layer that is independent of the first subsurface geological model and includes an upper boundary depth of the second subterranean layer; correlating a predicted landing zone for a plurality of wellbores using the first and second subsurface geological models that is based on a location of a horizontal portion of each wellbore; and generating data that comprises a representation of the correlated plurality of wellbores for presentation on a graphical user interface (GUI).

32 Claims, 7 Drawing Sheets

(56) References Cited

U.S. PATENT DOCUMENTS

| | | |
|---|---|---|
| 2018/0114158 A1 | 4/2018 | Foubert |
| 2018/0334902 A1 | 11/2018 | Olsen et al. |
| 2018/0335538 A1 | 11/2018 | Dupont et al. |
| 2020/0024938 A1* | 1/2020 | Fry .................. E21B 43/305 |
| 2020/0309992 A1* | 10/2020 | Alexander ............ G06F 30/27 |
| 2022/0155483 A1 | 5/2022 | Alexander |

OTHER PUBLICATIONS

PCT International Search Report and Written Opinion in International Application No. PCT/US2020/024393, dated Jul. 7, 2020, 11 pages.

Ajinnoko, O. O. "Application of Game Theory for Optimizing Drilling Cost Reduction Programmes." Offshore Technology Conference Asia. OnePetro, 2016. pp. 1-8. (Year: 2016).

\* cited by examiner

| Testing Survey | Upper Layer (UL) Model 404 | | | Lower Layer (LL) Model 406 | | | UL Tagging 408 | LL Tagging 410 | Disagree on Models 412 | Outcome 414 |
|---|---|---|---|---|---|---|---|---|---|---|
| 402 | In UL 405a | Above UL Top 405b | Below UL Base 405c | In LL 407a | Above LL Top 407b | Below LL Base 407c | | | | |
| Result 1 | 1 | 0 | 0 | 1 | 0 | 0 | 0 | 0 | 1 | Possible |
| Result 2 | 1 | 0 | 0 | 0 | 1 | 0 | 1 | 0 | 0 | Best |
| Result 3 | 0 | 1 | 0 | 1 | 0 | 0 | 0 | 0 | 1 | Unlikely |
| Result 4 | 0 | 1 | 0 | 0 | 1 | 0 | 0 | 0 | 1 | Possible |
| Result 5 | 0 | 0 | 1 | 1 | 0 | 0 | 0 | 1 | 0 | Best |
| Result 6 | 0 | 0 | 1 | 0 | 1 | 0 | 0 | 0 | 1 | Possible |

FIG. 4

DETERMINING A WELLBORE LANDING ZONE

TECHNICAL FIELD

This document relates to systems and methods for determining a wellbore landing zone and, more particularly, determining a wellbore landing zone in a particular reservoir layer among two or more reservoir layers.

BACKGROUND

Often, there are multiple subterranean layers (e.g., facies) within a hydrocarbon reservoir area (or "play"). For example, there are four main geological formations (or layers) in the Eagle Ford Play: Austin Chalk (AC), Upper Eagle Ford (UEF), Lower Eagle Ford (LEF) and Buda. As with any multiple layer play, wellbores drilled to extract the hydrocarbons can land in one of the layers. In some aspects, the particular subterranean layer that a wellbore (e.g., a horizontal portion of a directional wellbore) lands in may inform a geologist or operator of, for instance, a particular expected hydrocarbon recovery. Conventionally, in order to determine which formation each is targeting, geologists use subsea depth maps and vertical well logs to define the top and base of such formations. This data is then used by the geologists to create depth maps. To understand what geologic formation a well is targeting, a geologist can use the depth of the horizontal survey used in conjunction with these depth maps of the formations to understand well targets. Often, however, the process through which the geologists determine the targeted formation of a well is a very manual and tedious process and can lead to human errors.

SUMMARY

In example implementations, computer-implemented techniques are disclosed, including a computing system that includes one or more memory modules; and one or more hardware processors communicably coupled to the one or more memory modules and configured to execute instructions stored on the one or more memory modules to perform operations. The operations include identifying a first subsurface geological model of a first subterranean layer of a plurality of subterranean layers located under a terranean surface, the first subsurface geological model including an upper boundary depth of the first subterranean layer and a lower boundary depth of the first subterranean layer; identifying a second subsurface geological model of a second subterranean layer of the plurality of subterranean layers located under the terranean surface and deeper than the first subterranean layer, the second subsurface geological model independent of the first subsurface geological model and including an upper boundary depth of the second subterranean layer; correlating a predicted landing zone for each wellbore of a plurality of wellbores using the first and second subsurface geological models, the predicted landing zone for each wellbore of the plurality of wellbores based on a location of a horizontal portion of each wellbore; and generating data that includes a representation of the correlated plurality of wellbores for presentation on a graphical user interface (GUI).

In an aspect combinable with the example implementations, the first subsurface geological model includes directional well survey data from at least a first set of directional wellbores of the plurality of wellbores.

In another aspect combinable with any of the previous aspects, the second subsurface geological model includes directional well survey data from at least a second set of directional wellbores of the plurality of wellbores.

In another aspect combinable with any of the previous aspects, the first subsurface geological model further includes vertical well survey data from at least a first set of vertical wellbores of the plurality of wellbores.

In another aspect combinable with any of the previous aspects, the second subsurface geological model further includes vertical well survey data from at least a second set of vertical wellbores of the plurality of wellbores.

In another aspect combinable with any of the previous aspects, the first subsurface geological model further includes at least one geologic top of the first subterranean layer based on at least one of the directional well survey data from the first set of directional wellbores of the plurality of wellbores or the vertical well survey data from the first set of vertical wellbores of the plurality of wellbores.

In another aspect combinable with any of the previous aspects, the second subsurface geological model further includes at least one geologic top of the second subterranean layer based on at least one of the directional well survey data from the second set of directional wellbores of the plurality of wellbores or the vertical well survey data from the second set of vertical wellbores of the plurality of wellbores.

In another aspect combinable with any of the previous aspects, the at least one geologic top of the first subterranean layer includes a selection based on a production location depth from at least one of the directional well survey data from the first set of directional wellbores of the plurality of wellbores or the vertical well survey data from the first set of vertical wellbores of the plurality of wellbores.

In another aspect combinable with any of the previous aspects, the at least one geologic top of the second subterranean layer includes a selection based on a production location depth from at least one of the directional well survey data from the second set of directional wellbores of the plurality of wellbores or the vertical well survey data from the second set of vertical wellbores of the plurality of wellbores.

In another aspect combinable with any of the previous aspects, the upper boundary depth of the first subterranean layer at the production location depth from the directional well survey data from the first set of directional wellbores of the plurality of wellbores is a distance above the production location depth that is half of a thickness of the first subterranean layer.

In another aspect combinable with any of the previous aspects, the lower boundary depth of the first subterranean layer at the production location depth from the directional well survey data from the first set of directional wellbores of the plurality of wellbores is a distance below the production location depth that is half of the thickness of the first subterranean layer.

In another aspect combinable with any of the previous aspects, the upper boundary depth of the second subterranean layer at the production location depth from the directional well survey data from the second set of directional wellbores of the plurality of wellbores is a distance above the production location depth that is half of a thickness of the second subterranean layer.

In another aspect combinable with any of the previous aspects, the lower boundary depth of the first subterranean layer based on the first subsurface geological model of the first subterranean layer is not coincident with the upper boundary depth of the second subterranean layer based on the second subsurface geological model of the second subterranean layer.

In another aspect combinable with any of the previous aspects, the first subterranean layer is directly adjacent to and in contact with the second subterranean layer.

In another aspect combinable with any of the previous aspects, the operation of correlating the predicted landing zone for each wellbore of the plurality of wellbores in one of the first or second subterranean layers using the first and second subsurface geological models includes one of: determining an agreement of the predicted landing zone for one or more wellbores of the plurality of wellbores between the first and second subsurface geological models; or determining a disagreement of the predicted landing zone for one or more wellbores of the plurality of wellbores between the first and second subsurface geological models.

In another aspect combinable with any of the previous aspects, the operation of determining the agreement of the predicted landing zone for one or more wellbores of the plurality of wellbores between the first and second subsurface geological models includes determining the predicted landing zone for the wellbore in one of the first subterranean layer or the second subterranean layer from both of the first and second subsurface geological models; and assigning the wellbore to the one of the first subterranean layer or the second subterranean layer.

In another aspect combinable with any of the previous aspects, the operation of determining the disagreement of the predicted landing zone for one or more wellbores of the plurality of wellbores between the first and second subsurface geological models includes (i) determining at least one of: the predicted landing zone for the wellbore in the first subterranean layer from the first subsurface geological model and the predicted landing zone for the wellbore in the second subterranean layer from the second subsurface geological model, the predicted landing zone for the wellbore above the upper boundary depth of the first subterranean layer from the first subsurface geological model and the predicted landing zone for the wellbore above the upper boundary depth of the second subterranean layer from the second subsurface geological model, the predicted landing zone for the wellbore below the lower boundary depth of the first subterranean layer from the first subsurface geological model and the predicted landing zone for the wellbore above the upper boundary depth of the second subterranean layer from the second subsurface geological model, or the predicted landing zone for the wellbore above the upper boundary depth of the first subterranean layer from the first subsurface geological model and the predicted landing zone for the wellbore in the second subterranean layer from the second subsurface geological model; and In another aspect combinable with any of the previous aspects, the operation of determining the disagreement of the predicted landing zone for one or more wellbores of the plurality of wellbores between the first and second subsurface geological models further includes (ii) assigning the wellbore to one of the first subterranean layer or the second subterranean layer based on the determination in (i).

In another aspect combinable with any of the previous aspects, the operation of assigning the wellbore to one of the first subterranean layer or the second subterranean layer based on the determination in (i) includes determining another wellbore of the plurality of wellbores that is closest to the wellbore; determining a landing zone of the another wellbore of one of the first or second subterranean layers; and based on the determined landing zone of the another wellbore, assigning the wellbore to the one of the first or second subterranean layers.

In another aspect combinable with any of the previous aspects, the operations further include identifying additional directional well survey data for at least one additional directional wellbore in the first set of directional wellbores; updating the first subsurface geological model based on the additional directional well survey data of the at least one additional wellbore in the first set of directional wellbores; identifying additional directional well survey data for at least one additional directional wellbore in the second set of directional wellbores; and updating the second subsurface geological model based on the additional directional well survey data of the at least one additional directional wellbore in the second set of directional wellbores.

In another aspect combinable with any of the previous aspects, the operations further include identifying an additional landing zone selection for the at least one additional directional wellbore in the first set of directional wellbores; further updating the first subsurface geological model based on the additional landing zone selection for the at least one additional directional wellbore in the first set of directional wellbores; identifying an additional landing zone selection for the at least one additional directional wellbore in the second set of directional wellbores; and further updating the second subsurface geological model based on the additional landing zone selection for the at least one additional directional wellbore in the second set of directional wellbores.

In another aspect combinable with any of the previous aspects, the operations further include updating the predicted landing zone for each wellbore of the plurality of wellbores using the first and second updated subsurface geological models; and generating updated data that includes an updated representation of the correlated plurality of wellbores for presentation on the GUI.

In another aspect combinable with any of the previous aspects, the operations further include identifying a new wellbore formed from the terranean surface to one of the first or second subterranean layers; identifying directional well survey data for the new wellbore; based on the first and second subsurface geological models, assigning a landing zone of the new wellbore to one of the first or second subterranean layers; and generating new data that includes a representation of the assigned landing zone of the new wellbore for presentation on the GUI.

The general implementation and example aspects may also be realized in a computing system and computer-readable media. For example, a system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

One, some, or all of the implementations according to the present disclosure may include one or more of the following features. For example, implementations according to the present disclosure may combine geological interpretation with horizontal well directional surveys to create one or more subsurface models. Based on the created subsurface models, directional wellbores can be assigned more accurately to a particular subterranean formation as a landing zone. Another advantage of the implementations is to save manual working hours for geologists where they need to review and decide the landing zones of wellbores before. As another example, the created subsurface models can be updated when newly drilled wells with corresponding directional surveys are added, such that the created subsurface models are self-evolving models.

The details of one or more embodiments are set forth in the accompanying drawings and the description below. Other features, objects, and advantages will be apparent from the description and drawings, and from the claims.

DESCRIPTION OF DRAWINGS

FIG. 4 illustrates a table that shows possible outcomes of predicated landing zones from independent subsurface geological models according to the present disclosure.

DETAILED DESCRIPTION

This disclosure discusses techniques (e.g., computer-implemented method, computer program product, computer system) for determining a landing zone of a directional wellbore in a particular subterranean formation within a reservoir that includes multiple subterranean formations. In some aspects, two or more independent subsurface geologic models are created from, e.g., directional well surveys and other information, in order to make predictions of the correct landing zone for the directional wellbore. The predictions from the independent subsurface geologic models are corroborated for agreement or disagreement, and a landing zone is assigned to a particular formation as the landing zone.

Figure 1:
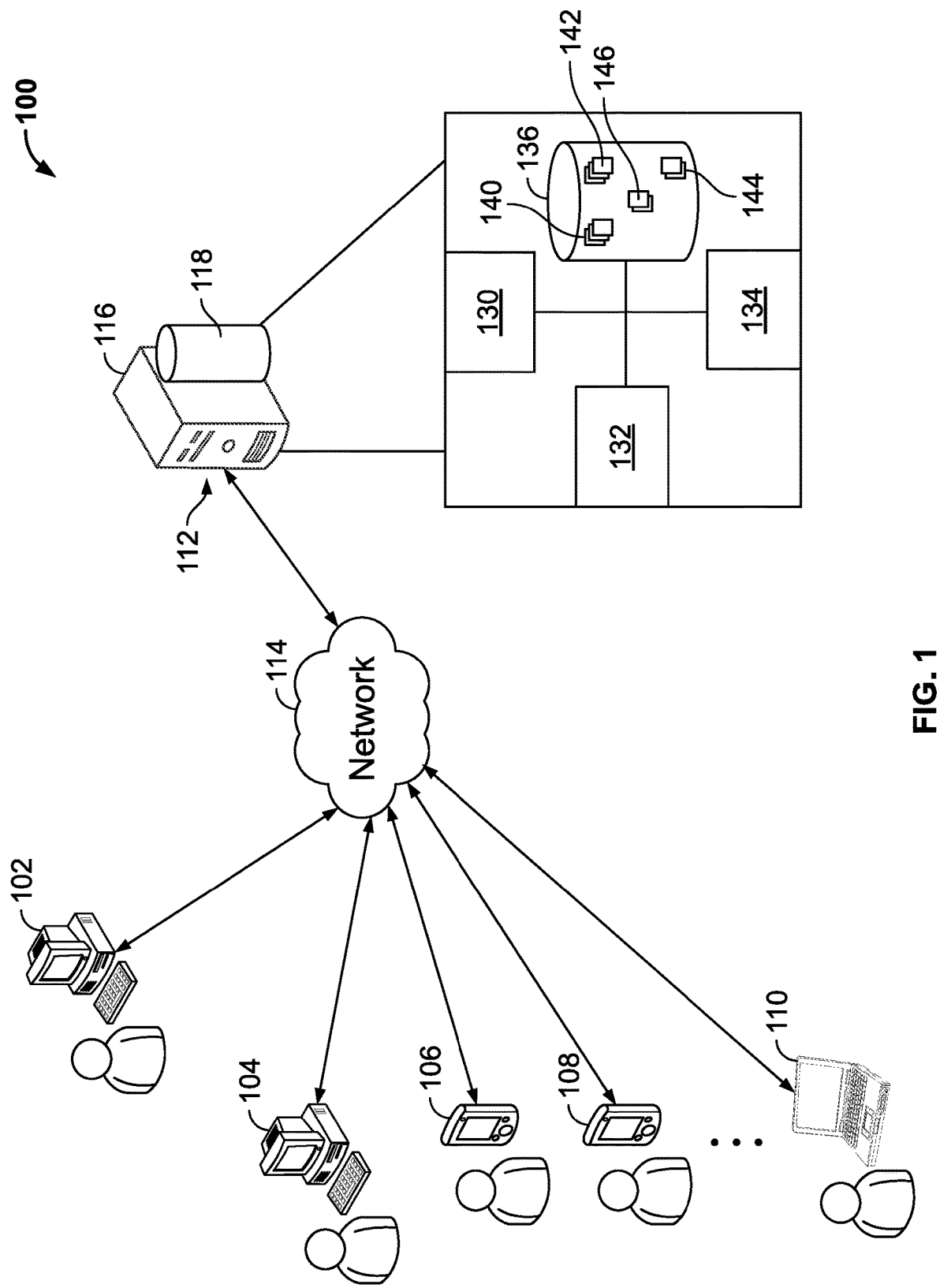
FIG. 1 illustrates an example distributed network architecture that includes one or more client devices and one or more server devices for determining a wellbore landing zone according to the present disclosure.

FIG. 1 illustrates an example distributed network architecture 100 that includes one or more client devices and one or more server devices that is operable to determine a wellbore landing zone according to the present disclosure. The network architecture 100 includes a number of client devices 102, 104, 106, 108, 110 communicably connected to a structured data processing server system 112 ("server system 112") by a network 114. The server system 112 includes a server device 116 and a data store 118. The server device 116 executes computer instructions (e.g., all or a part of a well operator solver application) stored in the data store 118 to perform functions of a well operator service. For example, in some aspects, the well operator service may be a subscription service available to the client devices 102, 104, 106, 108, and 110 (and other client devices) by an owner or operator of the server system 112. In some aspects, the server system 112 may be owned or operated by a third party (e.g., a collocation server system) that hosts the well operator service for the owner or operator of the well operator service.

Generally, and as described in more detail herein, all or a part of the distributed network architecture 100 is operable to determine a landing zone of one or more wellbores based on at least two independent subsurface geological models, where each subsurface geological model represents or models a particular subterranean formation (or layer) that can be the landing zone (e.g., of the horizontal portion of the one or more wellbores). In some aspects, each subsurface geological model is independent from the other subsurface geological models as subsurface data used to build each subsurface geological model is separate from the subsurface data used to build the other subsurface geological models. Further, each subsurface geological model is independent from the other subsurface geological models as there may be no model rules that force, for example, that a particular subsurface modeled layer is always on top of (i.e., shallower than) another subsurface modeled layer absent recorded, subsurface data that indicates as such.

Each independent subsurface geological model can include a modeled variable of depth with respect to sea-level, known as subsea depth. In some aspects, location data is referred to in the Universal Transverse Mercator (UTM) coordinate system for assigning coordinates to locations on the surface of the Earth while depth data is referred to as elevation with respect to sea level. The modeled depth in each model can includes, for instance, a top depth of the subsurface layer of the subsurface geological model, a bottom depth of the subsurface layer of the subsurface geological model, or an isopach depth of the subsurface layer of the subsurface geological model (e.g., in feet), or a combination thereof. As an example, the location range of the Eagle Ford Basin is from 345,000 to 855,000 meters in the East and from 3,055,000 to 3,500,000 meters in the North. The depth of the UEF and LEF formations decreases from Northwest to Southeast. The thickness of the UEF and LEF formations varies throughout the Eagle Ford Basin, with the thickest UEF and LEF formations occurring in the Eastern Extension.

Users of the client devices 102, 104, 106, 108, 110 access the server system 112 to participate in the well operator service. For example, the client devices 102, 104, 106, 108, 110 can execute web browser applications that can be used to access the well operator service. In another example, the client devices 102, 104, 106, 108, 110 can execute software applications that are specific to the well operator service (e.g., as "apps" running on smartphones). In other words, all of the well operator service may be hosted and executed on the server system 112. Or in alternative aspects, a portion of the well operator service may execute on the client devices 102, 104, 106, 108, and 110 (e.g., to receive and transmit information entered by a user of such client devices and/or to display output data from the well operator service to the user).

In some implementations, the client devices 102, 104, 106, 108, 110 can be provided as computing devices such as laptop or desktop computers, smartphones, personal digital assistants, portable media players, tablet computers, or other appropriate computing devices that can be used to communicate with an electronic social network. In some implementations, the server system 112 can be a single computing device such as a computer server. In some implementations, the server system 112 can represent more than one computing device working together to perform the actions of a server computer (e.g., cloud computing). In some implementations, the network 114 can be a public communication network (e.g., the Internet, cellular data network, dialup modems over a telephone network) or a private communications network (e.g., private LAN, leased lines).

As illustrated in FIG. 1, the server system 112 (e.g., the server device 116 and data store 118) includes one or more processing devices 132, a landing zone solver 130, one or more memory modules 136, and an interface 134. Generally, each of the components of the server system 112 are communicably coupled such that the one or more processing devices 132 may execute the landing zone solver 130 and access and manipulate data stored in the one or more memory modules 136. Data to be output from the server system 112, or data to be input to the server system 112, may be facilitated with the interface 134 that communicably couples the server system 112 to the network 114.

As illustrated in this example, the one or more memory modules 136 may store or reference one or more data sets. An example data set includes two or more independent subsurface geological models 140. Another data set includes one or more directional well surveys 142. Another data set includes one or more vertical well surveys 144. Another data set includes geologic top picks 146, e.g., by geologists based on the surveys 142 or 144 (or both). For example, in some aspects, a geologic top pick 146 made by a geologist can be made from one or more vertical well surveys 142. As another example, a geologic top pick 146 made by a geologist can be made from the vertical wellbore logs of one or more directional well surveys 144.

The data sets of the one or more directional well surveys 142, one or more vertical well surveys 144, and geologic top picks 146 can be used either singularly or in combination to generate the includes two or more independent subsurface geological models 140. The one or more memory modules 136 may store other portions of data that are determined or produced during execution of the landing zone solver 130 to, e.g., produce one or more graphical representations (or code translatable into graphical representations) of the determined landing zones for the one or more wellbores. Other data, either calculated or determined, generated by execution of the landing zone solver 130 (as described herein) may also be stored (even if transiently) in the one or more memory modules 136.

Figure 2A:
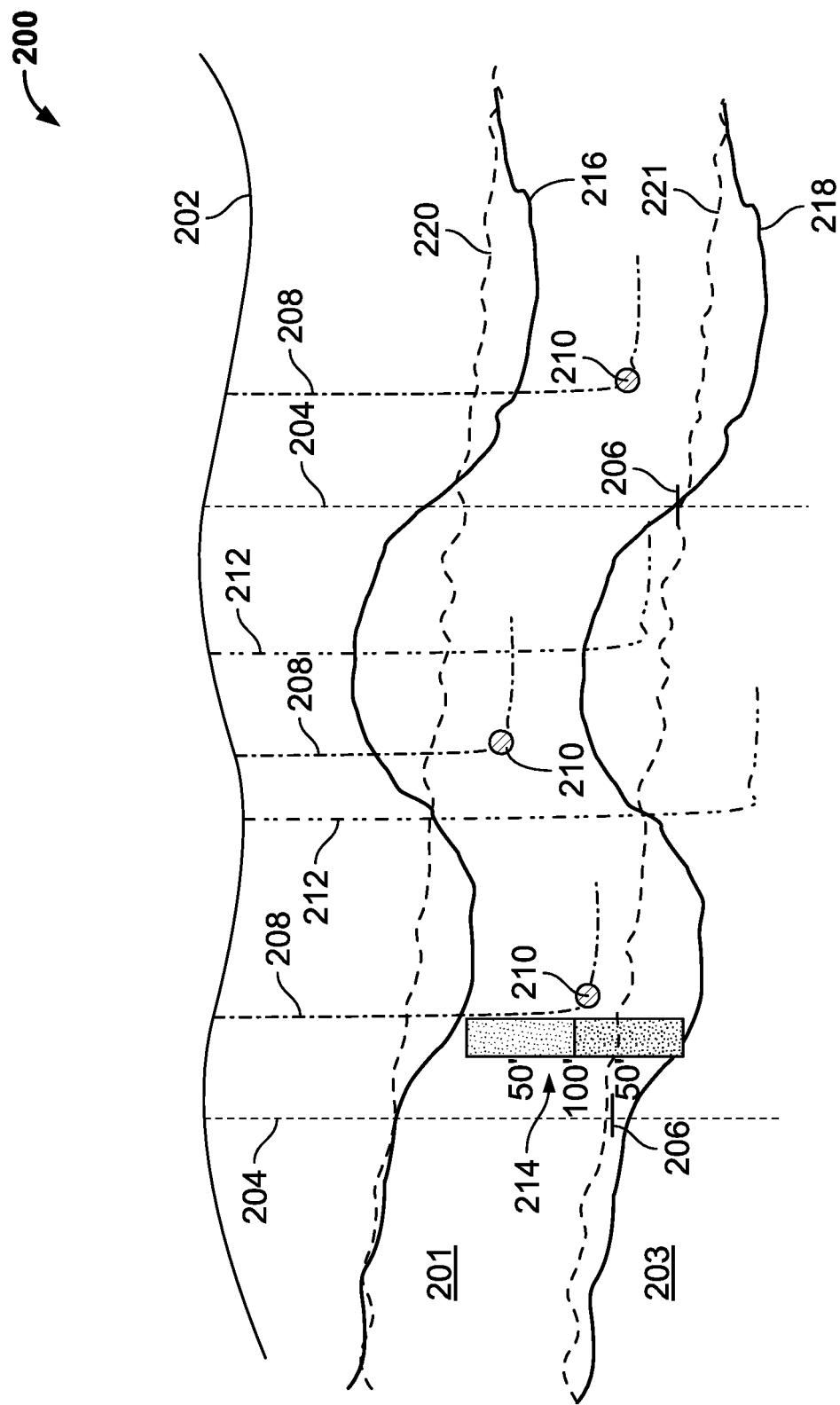
FIGS. 2A-2B illustrate schematic diagrams of wellbore systems that include one or more wellbores formed from a terranean surface that land in a subterranean layer of multiple subterranean layers of a hydrocarbon reservoir according to the present disclosure.
Figure 2B:
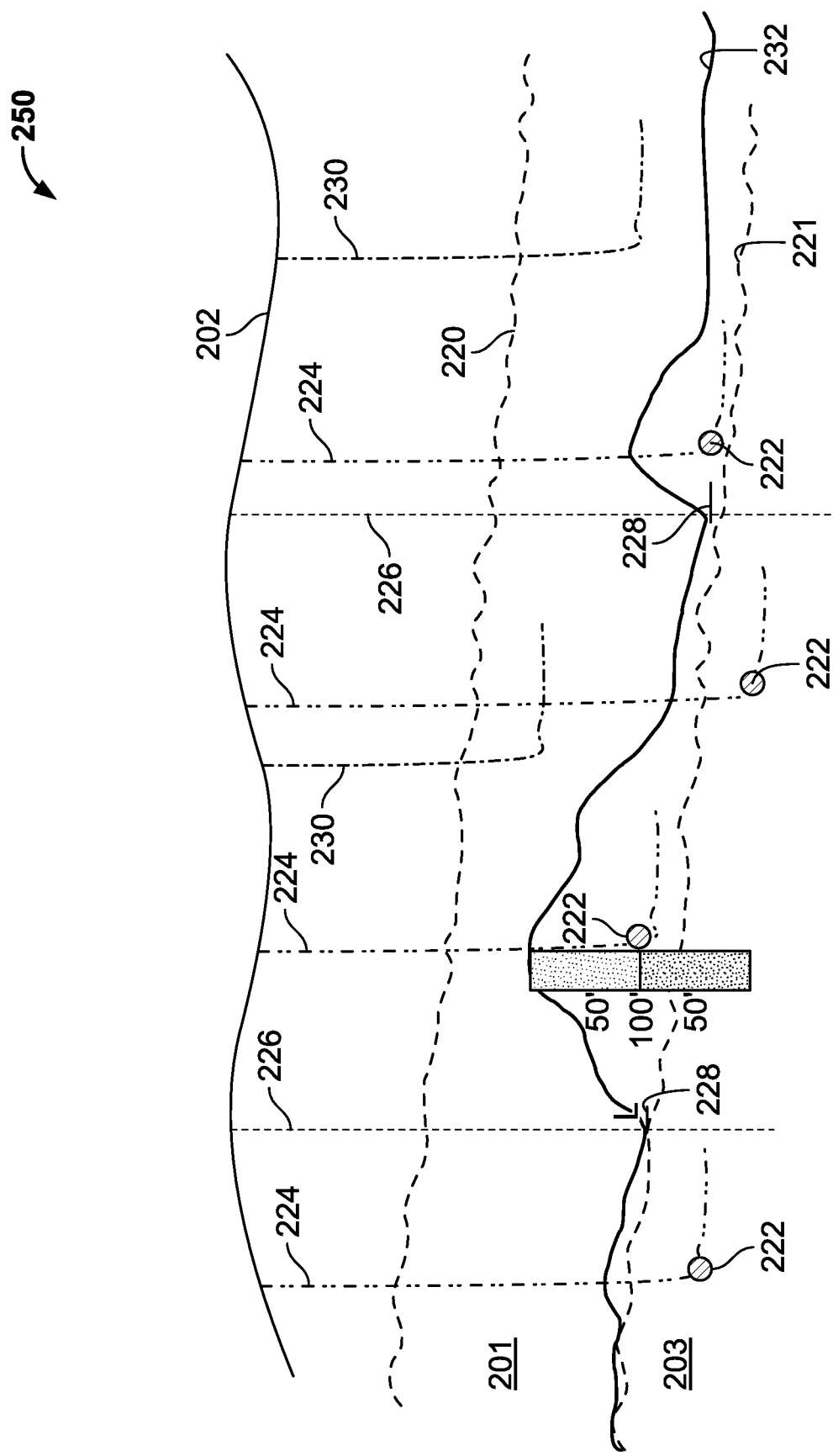

Turning to FIGS. 2A-2B, these figures illustrate schematic diagrams 200 and 250 of wellbore systems that include one or more wellbores formed from a terranean surface that land in a subterranean layer of multiple subterranean layers of a hydrocarbon reservoir, from which, the independent models 140 can be developed. For example, as shown in FIGS. 2A-2B, a first subterranean layer 201 that is defined by an upper boundary 220 and a lower boundary 221 lies adjacent and above (i.e., shallower than and closer to a terranean surface 202 than) a second subterranean layer 203. In this example, the first subterranean layer 201 is directly adjacent the second subterranean layer 203 such that the lower boundary 221 of the first subterranean layer 201 coincides with (within the Earth) an upper boundary of the second subterranean layer 203. In alternative examples, there can be one or more subterranean layers that are formed between the first subterranean layer 201 and the second subterranean layer 203. Of course, there can be one or multiple subterranean layers that lie above (e.g., shallower than and closer to the terranean surface 202 than) the first subterranean layer 201, and there can be one or multiple subterranean layers that lie below (e.g., deeper than and farther from the terranean surface 202 than) the second subterranean layer 203.

One or more wellbores are shown in the FIGS. 2A-2B formed from the terranean surface 202 into (and sometimes through) one or both of the subterranean layers 201 and 203. For example, in the schematic diagram 200, directional wellbores 208 (e.g., wellbores with a vertical portion and a horizontal portion or other wellbores that are not solely vertical in direction) extend from the terranean surface 202 into the first subterranean layer 201. Each directional wellbore 208 includes a perforation point 210 that, e.g., represents a first production point of that particular directional wellbore 208. In some aspects, the one or more directional well surveys 142 represent directional surveys of the directional wellbores 208 as shown in FIG. 2A.

FIG. 2A further shows directional wellbores 212. In this example, the directional wellbores 212 represent directional wellbores that do not land, e.g., do not include a horizontal portion that resides in, the first subterranean layer 201. For example, directional wellbores 212 can land in the second subterranean layer 203 or, in some cases, land in a subterranean layer below the second subterranean layer 203 or above the first subterranean layer 201.

FIG. 2A further shows vertical wellbores 204 that are formed from the terranean surface 202 into (and perhaps through) the first subterranean layer 201. In some aspects, the vertical wellbores 204 are test wellbores drilled to, e.g., determine a potential production of hydrocarbons from the first subterranean layer 201 (or other subterranean layers). A well log point 206 on each of the vertical wellbores 204 represents at least a portion of, e.g., the one or more vertical well surveys 144 that describe well log information for the vertical wellbores 204.

FIG. 2A also shows a model top 216 of the first subterranean layer 201 and a model base 218 of the first subterranean layer 201. As explained in more detail herein, based on, e.g., the one or more directional well surveys 142, the one or more vertical well surveys 144, and the geologic top picks 146, the landing zone solver 130 determines the model top 216 of the first subterranean layer 201 and the model base 218 of the first subterranean layer 201 from the two or more independent subsurface geologic models 140, such as an independent subsurface geologic model 140 for the first subterranean layer 201 and an independent subsurface geologic model 140 for the second subterranean layer 203. The model top 216 of the first subterranean layer 201, in some aspects, represents the modeled top boundary of the first subterranean layer 201. In some locations, the model top 216 coincides with the upper boundary 220; in other locations, the model top 216 can deviate from the upper boundary 220. Likewise, in some locations, the model base 218 coincides with the lower boundary 221; in other locations, the model base 218 can deviate from the lower boundary 221.

As further shown in schematic diagram 200, the model top 216 and the model base 218 are separated by a model distance 214 as determined by the two or more independent subsurface geologic models 140. For example, as explained in more detail herein, the model distance 214 can represent a thickness (e.g., an isopach) of the first subterranean layer 201 based on, e.g., the known depths of the perforation points 210 on the directional wellbores 208. For example, the model distance 214 can be determined based on a known or specified thickness of the first subterranean layer 201 (e.g., as determined by the one or more directional well surveys 142 and/or the vertical well surveys 144), with the perforation points 210 being assigned as a midpoint of the model distance 214 at their respective locations. Half of the thickness of the first subterranean layer 201 can be assigned to the model distance 214 above the midpoint, while the other half of the first subterranean layer 201 can be assigned to the model distance 214 below the midpoint.

In the schematic diagram 250, directional wellbores 224 (e.g., wellbores with a vertical portion and a horizontal portion or other wellbores that are not solely vertical in direction) extend from the terranean surface 202 into the second subterranean layer 203. Each directional wellbore 224 includes a perforation point 222 that, e.g., represents a first production point of that particular directional wellbore 224. In some aspects, the one or more directional well surveys 142 also represent directional surveys of the directional wellbores 224 as shown in FIG. 2B.

FIG. 2B further shows directional wellbores 230. In this example, the directional wellbores 230 represent directional wellbores that do not land, e.g., do not include a horizontal portion that resides in, the second subterranean layer 203. For example, directional wellbores 230 can land in the first subterranean layer 201 or, in some cases, land in a subterranean layer below the second subterranean layer 203 or above the first subterranean layer 201.

FIG. 2B further shows vertical wellbores 226 that are formed from the terranean surface 202 into (and perhaps through) the second subterranean layer 203. In some aspects, the vertical wellbores 226 are test wellbores drilled to, e.g., determine a potential production of hydrocarbons from the second subterranean layer 203 (or other subterranean layers). A well log point 228 on each of the vertical wellbores 226 represents at least a portion of, e.g., the one or more vertical well surveys 144 that describe well log information for the vertical wellbores 226.

FIG. 2B also shows a model top 232 of the second subterranean layer 203. As explained in more detail herein, based on, e.g., the one or more directional well surveys 142, the one or more vertical well surveys 144, and the geologic top picks 146, the landing zone solver 130 determines the model top 232 of the second subterranean layer 203 from the two or more independent subsurface geologic models 140, such as an independent subsurface geologic model 140 for the second subterranean layer 203. In example aspects, the independent subsurface geologic model 140 for the second subterranean layer 203 may or may not also determine a model base for the second subterranean layer 203. In this example, a model base is not determined or shown because, for instance, the second subterranean layer 203 (as the deeper subterranean layer to model) may be the deepest hydrocarbon bearing layer in this particular reservoir.

The model top 232 of the second subterranean layer 203, in some aspects, represents the modeled top boundary of the second subterranean layer 203. In some locations, the model top 232 coincides with the lower boundary 221, which is also an upper boundary of the second subterranean layer 203 in this example. In other locations, the model top 232 can deviate from the lower boundary 221. Further, in some aspects, the model top 232 may coincide with the model base 218; in other locations, the model top 232 can deviate from the model base 218.

In the Eagle Ford reservoir example, the UEF includes almost 5,000 vertical wells with a UEF upper boundary and over 4,000 vertical wells with a UEF lower boundary. The depth of the UEF upper boundary ranges from −15,857 ft. (i.e., 15,857 ft. below sea level) to −142 ft. The isopach values (i.e., thickness) range from 0 ft. to 738 ft. with an average thickness of 174 ft. and a standard deviation of 144 ft. Approximately 4,500 vertical wells have a LEF upper boundary ranging from −15,843 ft. to −580 ft. and 1,800 wells contain a Buda upper boundary, which represents the lower boundary of the LEF. The LEF isopach values vary from 0 ft. to 874 ft. with a mean thickness of 201 ft. and a standard deviation of 157 ft.

There are also 781 directional wells in the UEF with directional surveys and 24,860 directional wells in the LEF with directional surveys. In some aspects, as described, a first production point of a horizontal portion of a directional well can be extracted from the directional survey to represent the whole horizontal lateral survey. In some aspects, the first production point can be represented by a first perforated value after a kickoff point of the horizontal portion (e.g., which is above 80-degrees inclination). If a directional survey does not include perforation information, then a kickoff point location can represent the first production point. Thus, vertical well survey data from these wells could be used (e.g., in combination with directional well survey data) to build independent subsurface geologic models of the UEF and LEF in an example.

Figure 3A:
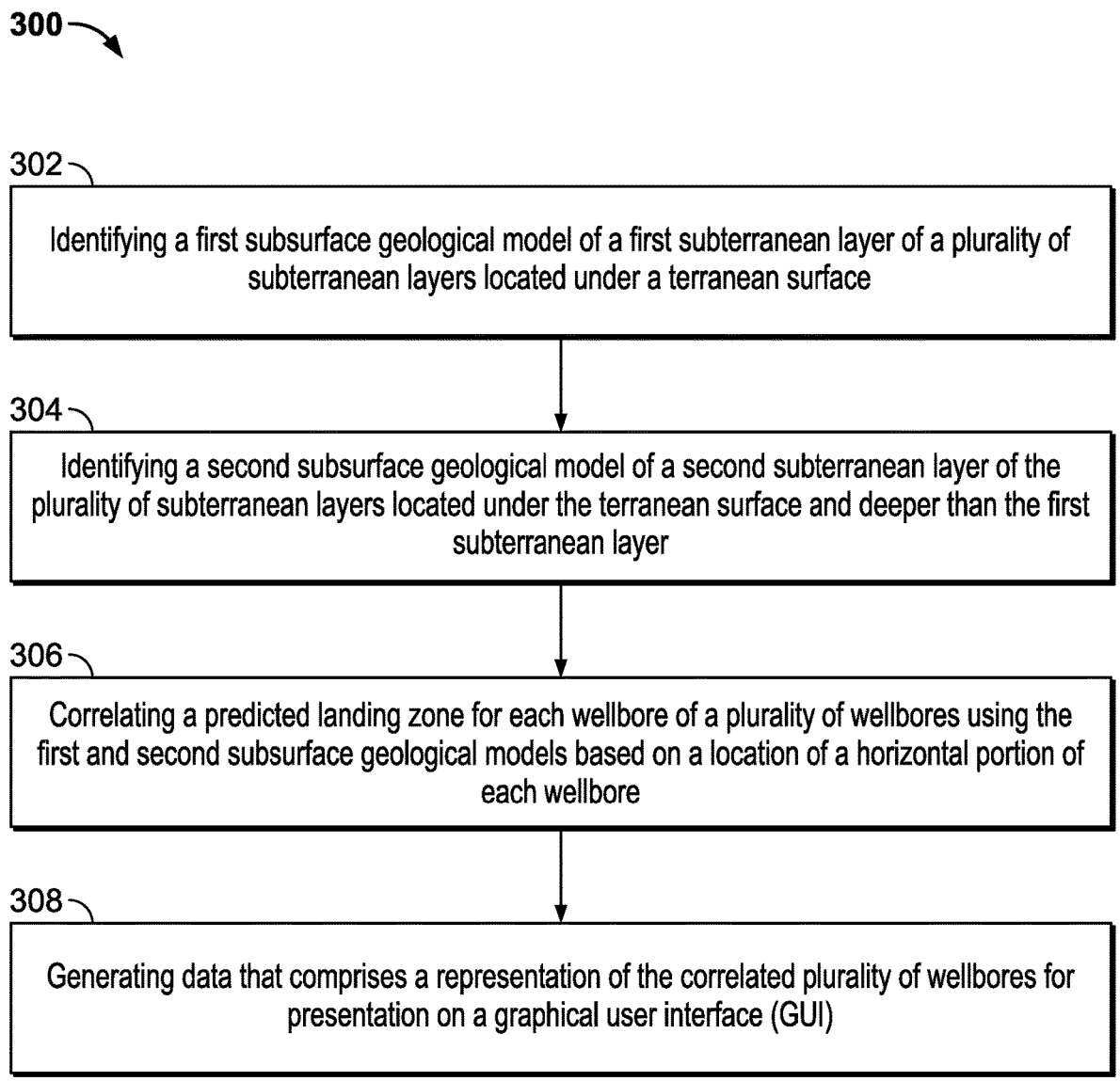
FIGS. 3A-3B illustrate flowcharts that describe methods for determining a wellbore landing zone according to the present disclosure.
Figure 3B:
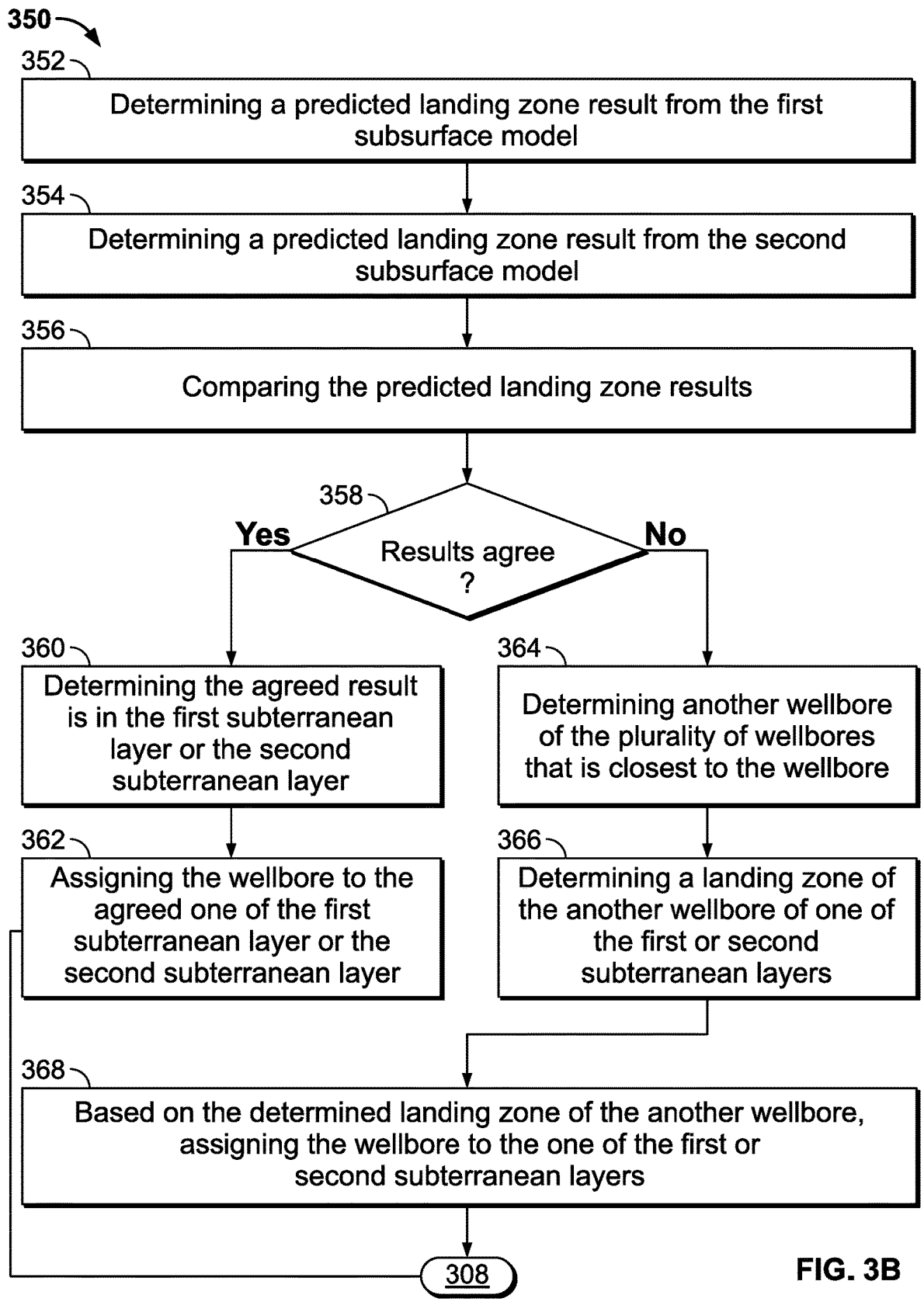

FIGS. 3A-3B illustrate flowcharts that describe methods for determining a wellbore landing zone according to the present disclosure. For example, FIG. 3A illustrates an example implementation of a method 300 for determining a wellbore landing zone, while FIG. 3B illustrates an example implementation of a sub-method 350 for step 306 of method 300 shown in FIG. 3A. In some aspects, the example methods shown in FIGS. 3A-3B can be executed with or by the landing zone solver 130 shown in FIG. 1.

Method 300 can begin at step 302, which includes identifying a first subsurface geological model of a first subterranean layer of a plurality of subterranean layers located under a terranean surface. For example, one of the independent subsurface geologic models 140 can represent the first subterranean layer. In some aspects, the independent subsurface geologic model that represents the first subterranean layer can include a model top that represents, in the model, an upper boundary of the first subterranean layer. The independent subsurface geologic model that represents the first subterranean layer can also include a model base that represents, in the model, a lower (i.e., deeper) boundary of the first subterranean layer. The independent subsurface geologic model that represents the first subterranean layer can also include a model thickness, e.g., an isopach, of the first subterranean layer.

Generally, the spatial relationships of the first subterranean layer can be captured and characterized by the geological data of the model top and model base. In some aspects, such model characteristics can come from the vertical well surveys, in which a human operator, such as a geologist, interprets the model top and the model base of the first subterranean layer. In some aspects, the thickness values for the first subterranean layer is modeled from the picked tops and bottoms and an isopach map is generated using statistical method as part of the independent subsurface geologic model for the first subterranean layer. In some aspects, having determined two of the tops, bottoms, or isopach of the first subterranean layer, the third value can be determined based on the dimensional relationships between the top, bottom, and isopach of a subterranean layer.

In some aspects, the independent subsurface geologic model that represents the first subterranean layer is generated based on directional well surveys or vertical well surveys, or both. The independent subsurface geologic model that represents the first subterranean layer is generated based also on a first perforation point along the horizontal survey or the kickoff point if no first perforation point (e.g., at 80 degrees). In some aspects, the first perforated point along the horizontal survey or the kickoff point can be identified by the landing zone solver 130. In some aspects, the first perforated point can be identified (e.g., by a human operator such as a geologist) from completion data for the directional wells, while the kickoff point can be algorithmically determined from the directional well survey. For example, the kickoff point can be a location determined from the directional well survey in which the directional well is directed at or about 80° from vertical, e.g., where the directional well turns from a curved portion into a horizontal (or substantially horizontal) wellbore portion.

In some aspects, the independent subsurface geologic model that represents the first subterranean layer can be generated on a grid model. For example, based on the first production point on the survey and on the vertical well survey, a grid can be generated in which only one data point will be used in each grid cell. For example, for any particular grid cell, if both a directional well survey and a vertical well survey include data for that grid cell, the directional well survey can be chosen as the data point, and the vertical well survey can be considered as redundant and can be removed before modeling. This occurs, for example, because the landing zone solver 130 chooses the directional well survey data as the priority, e.g., because there is higher confidence in directional survey data. If more than one directional well survey falls within a particular grid cell, the landing zone solver 130 can choose the directional well survey that is closest to the center of the grid to be used.

The first production point (e.g., the first perforation point or kickoff point) can be obtained from the directional well surveys to represent the entire horizontal portion of the directional wells described by the directional well surveys. In some aspects, the model top and model base are generated by the landing zone solver 130 by the first production points (from the directional well surveys) and half of the isopach at each grid cell location. The landing zone solver 130 then combines the geological tops selections (e.g., from the geologist) from the vertical well surveys to complete the generation of the model top and model base across the grid area.

In some aspects, the landing zone solver 130 generates the model thickness using an assumption that the directional well survey, e.g., the survey data point, is in the middle of the thickness of the first subterranean layer. This can be based on the isopach map that is created for the model from the model top and model base of the first subterranean layer. As noted, in some aspects, a geostatistical approach can be used to generate the isopach map and model thickness for the first subterranean layer. For example, a geostatistical approach can predict values at all unsampled locations within the model grid. A geostatistical technique for spatial prediction can include Kriging as a Best Linear Unbiased Estimation method in spatial statistics. The value at an unsampled location is estimated based on the structural characteristics of the observed data, which are summarized by the variogram/covariance model. The variogram captures the spatial dependence and accounts for the spatial configuration between samples: close samples tend to be more similar than distant samples. Such estimation is often applied on a regular grid using the irregular spaced data and the weights assigned to the nearby data. Estimation methods provide a unique and smooth model. The conditioning data is reproduced; however, the estimation does not produce the variabilities.

In this example, the landing zone solver 130 uses the Kriging algorithm to map the model top of the first subterranean layer, e.g., using the vertical well surveys and directional well surveys. The Kriging model then considers the isopach at each vertical well location and directional well location from the well surveys. The model, in this example, assumes that each directional well is placed in the middle of the first subterranean layer. Once the model top of the first subterranean layer is generated for the model, the model base of the first subterranean layer can be generated using the model isopach. In some aspects, the landing zone solver 130 models the model isopach for the first subterranean layer using a simple Kriging with a nugget effect of zero and a spherical structure model with 45 degrees in the azimuth, anisotropy ranges of 5000 and 5000 meters in the short-scale, and 300,000 and 180,000 meters in the large-scale considered.

Method 300 can continue at step 304, which includes identifying a second subsurface geological model of a second subterranean layer of the plurality of subterranean layers located under the terranean surface and deeper than the first subterranean layer. For example, the independent subsurface geologic model of the second subterranean layer can be generated, and then identified in step 304, similarly as the independent subsurface geologic model of the first subterranean layer. For example, the spatial relationships of the second subterranean layer can be captured and characterized by the geological data of the model top and model base. In some aspects, such model characteristics can come from the vertical well surveys, in which a human operator, such as a geologist, interprets at least the model top (and, in some aspects the model base if necessary) of the second subterranean layer. In some aspects, the thickness values for the first subterranean layer is modeled from the picked tops and bottoms and an isopach map is generated using statistical method as part of the independent subsurface geologic model for the second subterranean layer. In some aspects, having determined two of the tops, bottoms, or isopach of the second subterranean layer, the third value can be determined based on the dimensional relationships between the top, bottom, and isopach of a subterranean layer.

In some aspects, the independent subsurface geologic model that represents the second subterranean layer is generated based on directional well surveys or vertical well surveys, or both. The independent subsurface geologic model that represents the second subterranean layer is generated based also on a first perforation point along the horizontal survey or the kickoff point if no second perforation point (e.g., at 80 degrees). In some aspects, the second perforated point along the horizontal survey or the kickoff point can be automatically determined by the landing zone solver 130. In some aspects, the first perforated point along the horizontal survey or the kickoff point can be identified (e.g., by a human operator such as a geologist) from the directional survey.

In some aspects, the independent subsurface geologic model that represents the second subterranean layer can be generated on a grid model as well. For example, based on the first production point on the survey and on the vertical well survey, a grid can be generated in which only one data point will be used in each grid cell. For example, for any particular grid cell, if both a directional well survey and a vertical well survey include data for that grid cell, the directional well survey can be chosen as the data point, and the vertical well survey can be considered as redundant and can be removed before modeling. This occurs, for example, because the landing zone solver 130 chooses the directional well survey data as the priority, e.g., because there is higher confidence in directional survey data. If more than one directional well survey falls within a particular grid cell, the landing zone solver 130 can choose the directional well survey that is closest to the center of the grid to be used.

The first production point (e.g., the first perforation point or kickoff point) can be obtained from the directional well surveys to represent the entire horizontal portion of the directional wells described by the directional well surveys. In some aspects, the model is generated by the landing zone solver 130 by the first production points (from the directional well surveys) and half of the isopach at each grid cell location. The landing zone solver 130 then combines the geological tops selections (e.g., from the geologist) from the vertical well surveys to complete the generation of the model top across the grid area for the second subterranean layer.

In some aspects, the landing zone solver 130 generates the model thickness for the second subterranean layer using an assumption that the directional well survey, e.g., the survey data point, is in the middle of the thickness of the second subterranean layer. This can be based on the isopach map that is created for the model from the model top of the second subterranean layer. As noted, in some aspects, a geostatistical approach can be used to generate the isopach map and model thickness for the second subterranean layer. For example, a geostatistical approach can predict values at all unsampled locations within the model grid. A geostatistical technique for spatial prediction can include Kriging like the independent subsurface geologic model for the second subterranean layer. The value at an unsampled location is estimated based on the structural characteristics of the observed data, which are summarized by the variogram/covariance model. The variogram captures the spatial dependence and accounts for the spatial configuration between samples: close samples tend to be more similar than distant samples. Such estimation is often applied on a regular grid using the irregular spaced data and the weights assigned to the nearby data. Estimation methods provide a unique and smooth model. The conditioning data is reproduced; however, the estimation does not produce the variabilities.

In this example, the landing zone solver 130 uses the Kriging algorithm to map the model top of the second subterranean layer, e.g., using the vertical well surveys and directional well surveys. The Kriging model then considers the isopach at each vertical well location and directional well location from the well surveys. The model, in this example, assumes that each directional well is placed in the middle of the second subterranean layer. Once the model top of the second subterranean layer is generated for the model, the model base of the second subterranean layer (if needed) can be generated using the model isopach. In some aspects, the landing zone solver 130 models the model isopach for the second subterranean layer using a simple Kriging with a nugget effect of zero and a spherical structure model with 45 degrees in the azimuth, anisotropy ranges of 5000 and 5000 meters in the short-scale, and 300,000 and 180,000 meters in the large-scale considered.

In some aspects, each of the first and second subsurface models can be a geostatistical model trained on a particular data set of directional well surveys, vertical well surveys, and layer top selections. For instance, well survey data from both the first and second subsurface layers can be initially and randomly divided into a training dataset and a testing dataset. For example, 80% of the total survey data can be selected for conducting the geostatistical prediction (e.g., Kriging) and the remaining data can be considered for validating the kriged results. The training dataset is run through both models, with results of the landing zone predictions categorized into six different scenarios (as explained with reference to step 306).

Method 300 can continue at step 306, which includes correlating a predicted landing zone for each wellbore of a plurality of wellbores using the first and second subsurface geological models based on a location of a horizontal portion of each wellbore. For example, each independent subsurface geologic model can be used or interpreted by the landing zone solver 130 to predict or determine a particular landing zone of each directional wellbore formed from the surface into the reservoir. The landing zone, in some aspects, is a determination in which subterranean layer (e.g., of the first subterranean layer or the second subterranean layer) a horizontal portion of a directional wellbore resides or "lands" (e.g., all or substantially). As each of the at least two independent subsurface geologic models provide a prediction for each directional wellbore, the two or more predictions can be correlated or compared to determine a best or most likely landing zone of each directional wellbore.

For example, a sub-method 350 for step 306 of method 300 is shown in FIG. 3B as an example method of correlating the predicted landing zone for each wellbore of the plurality of wellbores using the first and second subsurface geological models. Sub-method 350 can begin at step 352, which includes determining a predicted landing zone result from the first subsurface model. For example, the first subsurface model, e.g., for each directional wellbore, determines a landing location of either the first or second subterranean layers based on the model top, the model base, or the model isopach thickness (or a combination of two or more) defined in the first subsurface model.

Sub-method 350 can continue at step 354, which includes determining a predicted landing zone result from the second subsurface model. For example, as with the first subsurface model, the second subsurface model, e.g., for each directional wellbore, determines a landing location of either the first or second subterranean layers based on the model top and the model isopach (and/or the model base if necessary) defined in the second subsurface model.

Sub-method 350 can continue at step 356, which includes comparing the predicted landing zone results. For example, as there are at least two predicted landing zones for each directional wellbore formed into the reservoir that includes the first and second subterranean layers, there can be agreement or disagreement among the predictions. And in some cases, a form of the disagreement can vary based on the at least two predicted results.

Sub-method 350 can continue at step 358, which includes a determination of whether the results compared in step 360 agree or disagree. For example, agreement between the first and second subsurface models can occur when each subsurface model predicts that the directional wellbore lands in the same one of the subterranean layers, i.e., the first subterranean layer or the second subterranean layer. Disagreement between the first and second subsurface models can occur when each subsurface model predicts that the directional wellbore lands in a different subterranean layer, whether the predicted layer is either the first subterranean layer or the second subterranean layer or another subterranean layer (e.g., above or shallower than the first subterranean layer, or below or deeper than the second subterranean layer).

Turning briefly to FIG. 4, this figure illustrates a table 400 that shows possible predicted landing zones from each of two independent subsurface geologic models, as well as the comparison in such predictions and outcome (agreement or disagreement, and if disagreement, type of disagreement). Table 400 includes column 402 that describes each "result" of six independent results in rows 416a-416f, with a result representing a particular directional wellbore formed from the surface into the reservoir. Table 400 also includes column 404 that describes an "upper layer" (UL) model (e.g., the first subsurface model) and sub-columns 405a-405c that show the predicted landing zone for each result, either in the upper layer (sub-column 405a, indicated as 1 if yes and 0 if no), above a model top of the upper layer (sub-column 405b, indicated as 1 if yes and 0 if no), or below the model base of the upper layer (sub-column 405c, indicated as 1 if yes and 0 if no). Table 400 also includes column 406 that describes an "lower layer" (LL) model (e.g., the second subsurface model) and sub-columns 407a-407c that show the predicted landing zone for each result, either in the lower layer (sub-column 407a, indicated as 1 if yes and 0 if no), above a model top of the lower layer (sub-column 407b, indicated as 1 if yes and 0 if no), or below the model base of the lower layer (sub-column 407c, indicated as 1 if yes and 0 if no). Column 408 shows a 1 when the upper and lower layer models agree that the result is in the upper layer (i.e., tagged in the upper layer) or a 0 when the upper and lower layer models do not agree that the result is in the upper layer. Column 410 shows a 1 when the upper and lower layer models agree that the result is in the lower layer (i.e., tagged in the lower layer) or a 0 when the upper and lower layer models do not agree that the result is in the lower layer. Column 412 shows a 1 when the upper and lower layer models disagree and a 0 when the upper and lower layer models agree. Finally, column 414 shows the outcome of the model prediction comparison, with "best" meaning agreement between the upper and lower layer models and either "possible" or "unlikely" for disagreement between the upper and lower layer models.

As shown in table 400, disagreement between the upper and lower layer models can be either a "possible" disagreement or an "unlikely" disagreement. A "possible" disagreement can occur when the layer models disagree on the result, but the disagreement is reasonable based on the two predictions from the upper and lower layer models. An "unlikely" disagreement can occur when the layer models disagree on the result, and the disagreement is unreasonable based on the two predictions from the upper and lower layer models.

For example, a "possible" disagreement can occur as shown in row 416a, when the upper layer model predicts that the directional wellbore lands in the upper layer, while the lower layer model predicts that the directional wellbore lands in the lower layer. Another "possible" disagreement can occur as shown in row 416d, when the upper layer model predicts that the directional wellbore lands above the model top of the upper layer, while the lower layer model predicts that the directional wellbore lands above the model top of the lower layer. Another "possible" disagreement can occur as shown in row 416f, when the upper layer model predicts that the directional wellbore lands below the model base of the upper layer, while the lower layer model predicts that the directional wellbore lands above the model top of the lower layer. As shown in table 400, an "unlikely" disagreement can occur as shown in row 416c, when the upper layer model predicts that the directional wellbore lands above the model top of the upper layer, while the lower layer model predicts that the directional wellbore lands in the lower layer.

Based on a "yes" determination in step 358, sub-method 350 can continue at step 360, which includes determining the agreed result is in the first subterranean layer or the second subterranean layer. For example, both of the first and second subsurface models, if in agreement as to the landing zone of the directional wellbore, will agree that the directional wellbore lands in the first subterranean layer or will agree that the directional wellbore lands in the second subterranean layer. Sub-method 350 can continue at step 362, which includes assigning the wellbore to the agreed one of the first subterranean layer or the second subterranean layer. For example, if the first and second subsurface models agree that the directional wellbore lands in the first subterranean layer, then the directional wellbore is assigned to the first subterranean layer. If the first and second subsurface models agree that the directional wellbore lands in the second subterranean layer, then the directional wellbore is assigned to the second subterranean layer. Subsequent to step 362, sub-method can return to step 308.

Based on a "no" determination in step 358, sub-method 350 can continue at step 364, which includes determining another wellbore of the plurality of wellbores that is closest to the wellbore. For example, in the event of a disagreement, the landing zone solver 130 can determine, from one or both of the first or second subsurface models, another directional wellbore within the model or models that is closest (e.g., in proximity) to the directional wellbore being examined in method 300. In some aspects, the next closest directional wellbore (e.g., a neighbor wellbore) selected is a directional wellbore in which the first and second subsurface models have previously agreed as to its landing zone (either in the first or second subterranean layers).

Sub-method 350 can continue at step 366, which includes determining a landing zone of the another wellbore of one of the first or second subterranean layers. For example, based on the another (or closest neighbor wellbore) being agreed to by the first and second subsurface models as landing in the first subterranean layer, the landing zone solver 130 determines that the closest neighbor wellbore has a landing zone of the first subterranean layer. Based on the another (or closest neighbor wellbore) being agreed to by the first and second subsurface models as landing in the second subterranean layer, the landing zone solver 130 determines that the closest neighbor wellbore has a landing zone of the second subterranean layer.

Sub-method 350 can continue at step 368, which includes based on the determined landing zone of the another wellbore, assigning the wellbore to the one of the first or second subterranean layers. For example, the landing zone solver 130 will assign the directional wellbore to the first subterranean layer as its landing zone if the closest neighbor wellbore is assigned to the first subterranean layer. The landing zone solver 130 will assign the directional wellbore to the second subterranean layer as its landing zone if the closest neighbor wellbore is assigned to the second subterranean layer. Subsequent to step 368, sub-method can return to step 308.

Method 300 can continue at step 308, which includes generating data that includes a representation of the correlated plurality of wellbores for presentation on a graphical user interface (GUI). For example, once or as each of the directional wellbores has been assigned to a particular landing zone, e.g., a particular one of the first or second subsurface layers, graphical representations of the assigned wellbores (or landing zones or both), such as images or text can be generated to present to a user. In some aspects, the generated data includes code operable to generate such images or text to present on the GUI.

While methods 300 and 350 illustrates some example operations performed by or with the landing zone solver 130, other methods or processes are also contemplated by the present disclosure. For example, new or additional wells, such as directional wells or vertical control wells can be formed within a particular reservoir and the well surveys from such wells can be added to the directional well surveys 142 and vertical well surveys 144. Next, the landing zone solver 130 can update the model tops and model bases and model thicknesses of the independent subsurface geological models with the updated directional well surveys 142 and vertical well surveys 144. Methods 300 and 350 can then be executed using the updated first and second subsurface models to generate the landing zone predictions of the directional wellbores formed into the reservoir as described.

In some aspects, a specific directional wellbore can be identified by the landing zone solver 130, such as through a request by a user or otherwise. The specific directional wellbore can be a wellbore that includes, e.g., a directional well survey and possibly other information (such as API number). In some cases, the specific directional wellbore and its associated directional well survey is not part of the directional well surveys 142. Thus, the landing zone solver 130 can add the directional well survey of the specific directional wellbore to the directional well surveys 142. Methods 300 and 350 can then be executed using the updated directional well surveys to generate the landing zone prediction of the specific directional wellbore identified by the landing zone solver 130.

Figure 5:
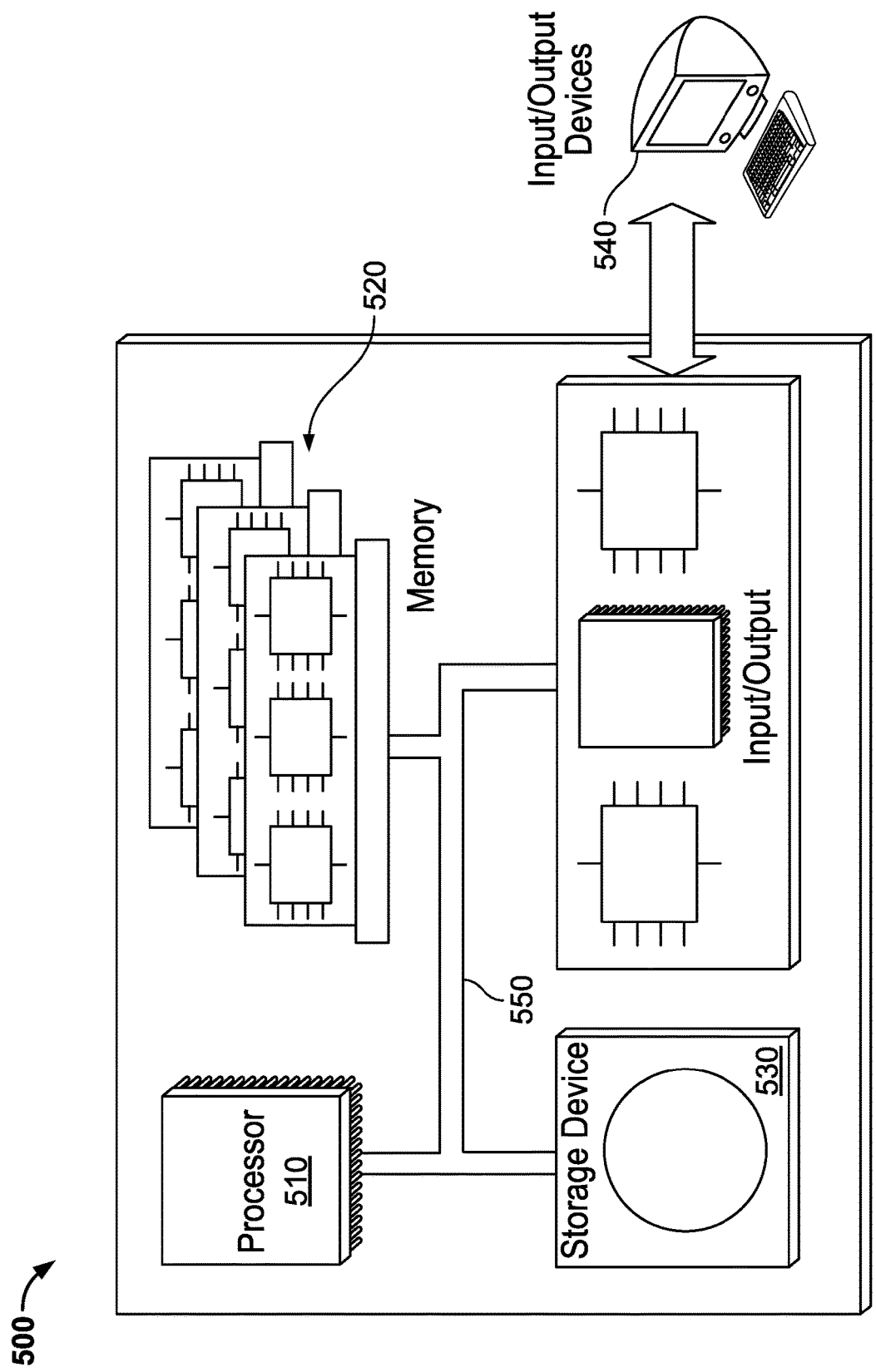
FIG. 5 is a schematic diagram of all or a portion of a computing system that can be used for the operations described in association with any of the computer-implemented processes described herein.

FIG. 5 is a schematic diagram of a computer system 500. The system 500 can be used for the operations described in association with any of the computer-implemented methods described previously, for example as or as part of the structured data processing server system 112 or other data processing systems described herein. The system 500 is intended to include various forms of digital computers, such as laptops, desktops, workstations, personal digital assistants, servers, blade servers, mainframes, and other appropriate computers. The system 500 can also include mobile devices, such as personal digital assistants, cellular telephones, smartphones, and other similar computing devices. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touch-screen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of embodiments have been described. Nevertheless, it will be understood that various modifications may be made without departing from the spirit and scope of what is described. For example, the steps of the exemplary flow charts in FIGS. 3A-3B may be performed in other orders, some steps may be removed, and other steps may be added. Accordingly, other embodiments are within the scope of the following claims.

What is claimed is:

1. A computer-implemented method performed with a computing system that comprises one or more hardware processors, comprising:
    identifying, with the one or more hardware processors, a first subsurface geological model of a first subterranean layer of a plurality of subterranean layers located under a terranean surface, the first subsurface geological model comprising an upper boundary depth of the first subterranean layer and a lower boundary depth of the first subterranean layer;
    identifying, with the one or more hardware processors, a second subsurface geological model of a second subterranean layer of the plurality of subterranean layers located under the terranean surface and deeper than the first subterranean layer, the second subsurface geological model independent of the first subsurface geological model and comprising an upper boundary depth of the second subterranean layer;
    correlating, with the one or more hardware processors, a predicted landing zone for each wellbore of a plurality of wellbores using the first and second subsurface geological models, the predicted landing zone for each wellbore of the plurality of wellbores based on a location of a horizontal portion of each wellbore; and
    generating, with the one or more hardware processors, data that comprises a representation of the correlated plurality of wellbores for presentation on a graphical user interface (GUI).

2. The computer-implemented method of claim 1, wherein the first subsurface geological model comprises directional well survey data from at least a first set of directional wellbores of the plurality of wellbores, and
    the second subsurface geological model comprises directional well survey data from at least a second set of directional wellbores of the plurality of wellbores.

3. The computer-implemented method of claim 2, wherein the first subsurface geological model further comprises vertical well survey data from at least a first set of vertical wellbores of the plurality of wellbores, and
    the second subsurface geological model further comprises vertical well survey data from at least a second set of vertical wellbores of the plurality of wellbores.

4. The computer-implemented method of claim 3, wherein the first subsurface geological model further comprises at least one geologic top of the first subterranean layer based on at least one of the directional well survey data from the first set of directional wellbores of the plurality of wellbores or the vertical well survey data from the first set of vertical wellbores of the plurality of wellbores, and
    the second subsurface geological model further comprises at least one geologic top of the second subterranean layer based on at least one of the directional well survey data from the second set of directional wellbores of the plurality of wellbores or the vertical well survey data from the second set of vertical wellbores of the plurality of wellbores.

5. The computer-implemented method of claim 4, wherein the at least one geologic top of the first subterranean layer comprises a selection based on a production location depth from at least one of the directional well survey data from the first set of directional wellbores of the plurality of wellbores or the vertical well survey data from the first set of vertical wellbores of the plurality of wellbores, and
    the at least one geologic top of the second subterranean layer comprises a selection based on a production location depth from at least one of the directional well survey data from the second set of directional wellbores of the plurality of wellbores or the vertical well survey data from the second set of vertical wellbores of the plurality of wellbores.

6. The computer-implemented method of claim 5, wherein:
    the upper boundary depth of the first subterranean layer at the production location depth from the directional well survey data from the first set of directional wellbores of the plurality of wellbores is a distance above the production location depth that is half of a thickness of the first subterranean layer,
    the lower boundary depth of the first subterranean layer at the production location depth from the directional well survey data from the first set of directional wellbores of the plurality of wellbores is a distance below the production location depth that is half of the thickness of the first subterranean layer, and
    the upper boundary depth of the second subterranean layer at the production location depth from the directional well survey data from the second set of directional wellbores of the plurality of wellbores is a distance above the production location depth that is half of a thickness of the second subterranean layer.

7. The computer-implemented method of claim 6, wherein the lower boundary depth of the first subterranean layer based on the first subsurface geological model of the first subterranean layer is not coincident with the upper boundary depth of the second subterranean layer based on the second subsurface geological model of the second subterranean layer.

8. The computer-implemented method of claim 1, wherein the first subterranean layer is directly adjacent to and in contact with the second subterranean layer.

9. The computer-implemented method of claim 1, wherein correlating the predicted landing zone for each wellbore of the plurality of wellbores in one of the first or second subterranean layers using the first and second subsurface geological models comprises one of:
   determining, with the one or more hardware processors, an agreement of the predicted landing zone for one or more wellbores of the plurality of wellbores between the first and second subsurface geological models; or
   determining, with the one or more hardware processors, a disagreement of the predicted landing zone for one or more wellbores of the plurality of wellbores between the first and second subsurface geological models.

10. The computer-implemented method of claim 9, wherein determining the agreement of the predicted landing zone for one or more wellbores of the plurality of wellbores between the first and second subsurface geological models comprises:
   determining, with the one or more hardware processors, the predicted landing zone for the wellbore in one of the first subterranean layer or the second subterranean layer from both of the first and second subsurface geological models; and
   assigning, with the one or more hardware processors, the wellbore to the one of the first subterranean layer or the second subterranean layer.

11. The computer-implemented method of claim 9, wherein determining the disagreement of the predicted landing zone for one or more wellbores of the plurality of wellbores between the first and second subsurface geological models comprises:
   (i) determining, with the one or more hardware processors, at least one of:
      the predicted landing zone for the wellbore in the first subterranean layer from the first subsurface geological model and the predicted landing zone for the wellbore in the second subterranean layer from the second subsurface geological model,
      the predicted landing zone for the wellbore above the upper boundary depth of the first subterranean layer from the first subsurface geological model and the predicted landing zone for the wellbore above the upper boundary depth of the second subterranean layer from the second subsurface geological model,
      the predicted landing zone for the wellbore below the lower boundary depth of the first subterranean layer from the first subsurface geological model and the predicted landing zone for the wellbore above the upper boundary depth of the second subterranean layer from the second subsurface geological model, or
      the predicted landing zone for the wellbore above the upper boundary depth of the first subterranean layer from the first subsurface geological model and the predicted landing zone for the wellbore in the second subterranean layer from the second subsurface geological model; and
   (ii) assigning, with the one or more hardware processors, the wellbore to one of the first subterranean layer or the second subterranean layer based on the determination in (i).

12. The computer-implemented method of claim 11, wherein assigning the wellbore to one of the first subterranean layer or the second subterranean layer based on the determination in (i) comprises:
   determining, with the one or more hardware processors, another wellbore of the plurality of wellbores that is closest to the wellbore;
   determining, with the one or more hardware processors, a landing zone of the another wellbore of one of the first or second subterranean layers; and
   based on the determined landing zone of the another wellbore, assigning, with the one or more hardware processors, the wellbore to the one of the first or second subterranean layers.

13. The computer-implemented method of claim 2, further comprising:
   identifying, with the one or more hardware processors, additional directional well survey data for at least one additional directional wellbore in the first set of directional wellbores;
   updating, with the one or more hardware processors, the first subsurface geological model based on the additional directional well survey data of the at least one additional wellbore in the first set of directional wellbores;
   identifying, with the one or more hardware processors, additional directional well survey data for at least one additional directional wellbore in the second set of directional wellbores; and
   updating, with the one or more hardware processors, the second subsurface geological model based on the additional directional well survey data of the at least one additional directional wellbore in the second set of directional wellbores.

14. The computer-implemented method of claim 13, further comprising:
   identifying, with the one or more hardware processors, an additional landing zone selection for the at least one additional directional wellbore in the first set of directional wellbores;
   further updating, with the one or more hardware processors, the first subsurface geological model based on the additional landing zone selection for the at least one additional directional wellbore in the first set of directional wellbores;
   identifying, with the one or more hardware processors, an additional landing zone selection for the at least one additional directional wellbore in the second set of directional wellbores; and
   further updating, with the one or more hardware processors, the second subsurface geological model based on the additional landing zone selection for the at least one additional directional wellbore in the second set of directional wellbores.

15. The computer-implemented method of claim 13, further comprising:
   updating, with the one or more hardware processors, the predicted landing zone for each wellbore of the plurality of wellbores using the first and second updated subsurface geological models; and generating, with the one or more hardware processors, updated data that comprises an updated representation of the correlated plurality of wellbores for presentation on the GUI.

16. The computer-implemented method of claim 1, further comprising:
identifying, with the one or more hardware processors, a new wellbore formed from the terranean surface to one of the first or second subterranean layers;
identifying, with the one or more hardware processors, directional well survey data for the new wellbore;
based on the first and second subsurface geological models, assigning, with the one or more hardware processors, a landing zone of the new wellbore to one of the first or second subterranean layers; and
generating, with the one or more hardware processors, new data that comprises a representation of the assigned landing zone of the new wellbore for presentation on the GUI.

17. A computing system, comprising:
one or more memory modules;
one or more hardware processors communicably coupled to the one or more memory modules, the one or more hardware processors configured to execute instructions stored on the one or more memory modules to perform operations comprising:
identifying a first subsurface geological model of a first subterranean layer of a plurality of subterranean layers located under a terranean surface, the first subsurface geological model comprising an upper boundary depth of the first subterranean layer and a lower boundary depth of the first subterranean layer;
identifying a second subsurface geological model of a second subterranean layer of the plurality of subterranean layers located under the terranean surface and deeper than the first subterranean layer, the second subsurface geological model independent of the first subsurface geological model and comprising an upper boundary depth of the second subterranean layer;
correlating a predicted landing zone for each wellbore of a plurality of wellbores using the first and second subsurface geological models, the predicted landing zone for each wellbore of the plurality of wellbores based on a location of a horizontal portion of each wellbore; and
generating data that comprises a representation of the correlated plurality of wellbores for presentation on a graphical user interface (GUI).

18. The computing system of claim 17, wherein the first subsurface geological model comprises directional well survey data from at least a first set of directional wellbores of the plurality of wellbores, and
the second subsurface geological model comprises directional well survey data from at least a second set of directional wellbores of the plurality of wellbores.

19. The computing system of claim 18, wherein the first subsurface geological model further comprises vertical well survey data from at least a first set of vertical wellbores of the plurality of wellbores, and
the second subsurface geological model further comprises vertical well survey data from at least a second set of vertical wellbores of the plurality of wellbores.

20. The computing system of claim 19, wherein the first subsurface geological model further comprises at least one geologic top of the first subterranean layer based on at least one of the directional well survey data from the first set of directional wellbores of the plurality of wellbores or the vertical well survey data from the first set of vertical wellbores of the plurality of wellbores, and
the second subsurface geological model further comprises at least one geologic top of the second subterranean layer based on at least one of the directional well survey data from the second set of directional wellbores of the plurality of wellbores or the vertical well survey data from the second set of vertical wellbores of the plurality of wellbores.

21. The computing system of claim 20, wherein the at least one geologic top of the first subterranean layer comprises a selection based on a production location depth from at least one of the directional well survey data from the first set of directional wellbores of the plurality of wellbores or the vertical well survey data from the first set of vertical wellbores of the plurality of wellbores, and
the at least one geologic top of the second subterranean layer comprises a selection based on a production location depth from at least one of the directional well survey data from the second set of directional wellbores of the plurality of wellbores or the vertical well survey data from the second set of vertical wellbores of the plurality of wellbores.

22. The computing system of claim 21, wherein:
the upper boundary depth of the first subterranean layer at the production location depth from the directional well survey data from the first set of directional wellbores of the plurality of wellbores is a distance above the production location depth that is half of a thickness of the first subterranean layer,
the lower boundary depth of the first subterranean layer at the production location depth from the directional well survey data from the first set of directional wellbores of the plurality of wellbores is a distance below the production location depth that is half of the thickness of the first subterranean layer, and
the upper boundary depth of the second subterranean layer at the production location depth from the directional well survey data from the second set of directional wellbores of the plurality of wellbores is a distance above the production location depth that is half of a thickness of the second subterranean layer.

23. The computing system of claim 22, wherein the lower boundary depth of the first subterranean layer based on the first subsurface geological model of the first subterranean layer is not coincident with the upper boundary depth of the second subterranean layer based on the second subsurface geological model of the second subterranean layer.

24. The computing system of claim 17, wherein the first subterranean layer is directly adjacent to and in contact with the second subterranean layer.

25. The computing system of claim 17, wherein the operation of correlating the predicted landing zone for each wellbore of the plurality of wellbores in one of the first or second subterranean layers using the first and second subsurface geological models comprises one of:
determining an agreement of the predicted landing zone for one or more wellbores of the plurality of wellbores between the first and second subsurface geological models; or
determining a disagreement of the predicted landing zone for one or more wellbores of the plurality of wellbores between the first and second subsurface geological models.

26. The computing system of claim 25, wherein the operation of determining the agreement of the predicted landing zone for one or more wellbores of the plurality of wellbores between the first and second subsurface geological models comprises:
  determining the predicted landing zone for the wellbore in one of the first subterranean layer or the second subterranean layer from both of the first and second subsurface geological models; and
  assigning the wellbore to the one of the first subterranean layer or the second subterranean layer.

27. The computing system of claim 25, wherein the operation of determining the disagreement of the predicted landing zone for one or more wellbores of the plurality of wellbores between the first and second subsurface geological models comprises:
  (i) determining at least one of:
    the predicted landing zone for the wellbore in the first subterranean layer from the first subsurface geological model and the predicted landing zone for the wellbore in the second subterranean layer from the second subsurface geological model,
    the predicted landing zone for the wellbore above the upper boundary depth of the first subterranean layer from the first subsurface geological model and the predicted landing zone for the wellbore above the upper boundary depth of the second subterranean layer from the second subsurface geological model,
    the predicted landing zone for the wellbore below the lower boundary depth of the first subterranean layer from the first subsurface geological model and the predicted landing zone for the wellbore above the upper boundary depth of the second subterranean layer from the second subsurface geological model, or
    the predicted landing zone for the wellbore above the upper boundary depth of the first subterranean layer from the first subsurface geological model and the predicted landing zone for the wellbore in the second subterranean layer from the second subsurface geological model; and
  (ii) assigning the wellbore to one of the first subterranean layer or the second subterranean layer based on the determination in (i).

28. The computing system of claim 27, wherein the operation of assigning the wellbore to one of the first subterranean layer or the second subterranean layer based on the determination in (i) comprises:
  determining another wellbore of the plurality of wellbores that is closest to the wellbore;
  determining a landing zone of the another wellbore of one of the first or second subterranean layers; and
  based on the determined landing zone of the another wellbore, assigning the wellbore to the one of the first or second subterranean layers.

29. The computing system of claim 18, wherein the operations further comprise:
  identifying additional directional well survey data for at least one additional directional wellbore in the first set of directional wellbores;
  updating the first subsurface geological model based on the additional directional well survey data of the at least one additional wellbore in the first set of directional wellbores;
  identifying additional directional well survey data for at least one additional directional wellbore in the second set of directional wellbores; and
  updating the second subsurface geological model based on the additional directional well survey data of the at least one additional directional wellbore in the second set of directional wellbores.

30. The computing system of claim 29, wherein the operations further comprise:
  identifying an additional landing zone selection for the at least one additional directional wellbore in the first set of directional wellbores;
  further updating the first subsurface geological model based on the additional landing zone selection for the at least one additional directional wellbore in the first set of directional wellbores;
  identifying an additional landing zone selection for the at least one additional directional wellbore in the second set of directional wellbores; and
  further updating the second subsurface geological model based on the additional landing zone selection for the at least one additional directional wellbore in the second set of directional wellbores.

31. The computing system of claim 29, wherein the operations further comprise:
  updating the predicted landing zone for each wellbore of the plurality of wellbores using the first and second updated subsurface geological models; and
  generating updated data that comprises an updated representation of the correlated plurality of wellbores for presentation on the GUI.

32. The computing system of claim 17, wherein the operations further comprise:
  identifying a new wellbore formed from the terranean surface to one of the first or second subterranean layers;
  identifying directional well survey data for the new wellbore;
  based on the first and second subsurface geological models, assigning a landing zone of the new wellbore to one of the first or second subterranean layers; and
  generating new data that comprises a representation of the assigned landing zone of the new wellbore for presentation on the GUI.

* * * * *